United States Patent
Shin et al.

(10) Patent No.: US 11,153,037 B2
(45) Date of Patent: Oct. 19, 2021

(54) METHOD AND APPARATUS FOR ENCODING ERASURE CODE FOR STORING DATA

(71) Applicant: INDUSTRY-UNIVERSITY COOPERATION FOUNDATION HANYANG UNIVERSITY, Seoul (KR)

(72) Inventors: Dong-Joon Shin, Seoul (KR); Ji Ho Kim, Seoul (KR); Jin Soo Lim, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/634,451

(22) PCT Filed: Jul. 25, 2018

(86) PCT No.: PCT/KR2018/008427
§ 371 (c)(1),
(2) Date: Jan. 27, 2020

(87) PCT Pub. No.: WO2019/022508
PCT Pub. Date: Jan. 31, 2019

(65) Prior Publication Data
US 2021/0091789 A1    Mar. 25, 2021

(30) Foreign Application Priority Data
Jul. 28, 2017   (KR) .................. 10-2017-0096303

(51) Int. Cl.
*H04L 1/00* (2006.01)
*H03M 13/09* (2006.01)
*H03M 13/11* (2006.01)

(52) U.S. Cl.
CPC .......... *H04L 1/0061* (2013.01); *H03M 13/09* (2013.01); *H03M 13/1102* (2013.01); *H04L 1/0041* (2013.01)

(58) Field of Classification Search
CPC ...... H03M 13/13; H03M 13/27; H03M 13/09; H03M 13/1102; H03M 13/036;
(Continued)

(56) References Cited

U.S. PATENT DOCUMENTS 7,904,782 B2 * 3/2011 Huang .............. H03M 13/2918
                                                    714/752
9,378,088 B1 * 6/2016 Piszczek ............... G06F 3/0685
9,600,365 B2 * 3/2017 Fetterly ............... G06F 11/1076
(Continued)

FOREIGN PATENT DOCUMENTS

KR    10-2014-0080919 A    7/2014
KR       10-1684045 B1    12/2016
(Continued)

OTHER PUBLICATIONS

Gopalan et al., On the locality of codeword symbols, Nov. 2012, IEEE Trans. on Info. Theory, vol. 58, No. 11, pp. 6925 to 6934.*
(Continued)

*Primary Examiner* — Shelly A Chase
(74) *Attorney, Agent, or Firm* — Sughrue Mion, PLLC

(57) ABSTRACT

Disclosed is a method and apparatus for encoding an erasure code for storing data. The disclosed method for encoding an erasure code comprises the steps of: (a) generating a first local parity group including two or more local parity nodes for data nodes; (b) generating at least one global parity node for the data nodes; (c) generating at least one second local parity group including two or more local parity nodes for the data nodes; and (d) storing the data nodes, the first local parity group, the second local parity group, and the global
(Continued)

parity node. According to the disclosed method, it is possible to store and recover data safely and efficiently.

10 Claims, 6 Drawing Sheets

(58) Field of Classification Search
CPC ............ H03M 13/3761; G06F 11/1076; H04L 1/0041; H04L 1/0061
See application file for complete search history.

(56) References Cited

U.S. PATENT DOCUMENTS

| | | |
|---|---|---|
| 2016/0211869 A1 | 7/2016 | Blaum et al. |
| 2016/0380650 A1 | 12/2016 | Calder et al. |

FOREIGN PATENT DOCUMENTS

| | | | | |
|---|---|---|---|---|
| KR | 10-1731832 B1 | 5/2017 | | |
| WO | WO-2018029212 A1 * | 2/2018 | .......... | H03M 13/036 |

OTHER PUBLICATIONS

Song et al., Erasure codes with symbol locality and group decodability for distributed storage, 2015, IEEE, pp. 74 to 78.*

Kamath et al., Codes with local regeneration and erasure correction, Aug. 2014, IEEE, Trans. on Information Theory, vol. 60, No. 8, pp. 4637-4660.*

International Search Report for PCT/KR2018/008427 dated Nov. 1, 2018 [PCT/ISA/210].

* cited by examiner

| type | number of cases of node failures $Nf$ | | | | | |
|---|---|---|---|---|---|---|
| | 1 | 2 | 3 | 4 | 5 | 6 |
| (8,2,2)-LRC | 100% | 100% | 100% | 85.86% | 0% | 0% |
| (10,2,2)-LRC | 100% | 100% | 100% | 86.01% | 0% | 0% |
| (12,2,2)-LRC | 100% | 100% | 100% | 86.15% | 0% | 0% |
| (8,2,2,1) E-LRC | 100% | 100% | 100% | 97.20% | 80.03% | 0% |
| (10,2,2,1) E-LRC | 100% | 100% | 100% | 97.07% | 80.22% | 0% |
| (12,2,2,1) E-LRC | 100% | 100% | 100% | 97.48% | 81.45% | 0% |

METHOD AND APPARATUS FOR ENCODING ERASURE CODE FOR STORING DATA

CROSS-REFERENCE TO RELATED APPLICATIONS

This application is a National Phase Application of PCT International Application No. PCT/KR2018/008427, which was filed on Jul. 25, 2018, and which claims priority from Korean Patent Application No. 10-2017-0096303 filed with the Korean Intellectual Property Office on Jul. 28, 2017. The disclosures of the above patent applications are incorporated herein by reference in their entirety.

BACKGROUND

1. Technical Field

The present invention relates to a method and an apparatus for encoding erasure code for storing data.

2. Description of the Related Art

As big data becomes ever more important, there is a growing need for an efficient system for storing and managing data. A storage system for handling big data must be able to provide expandability for adapting to data sizes in a flexible manner as well as ensure safe storage of the data. As such, the concept of utilizing error correction code for storing data safely is increasingly gaining attention.

SUMMARY OF THE INVENTION

To resolve the problems found in the related art above, an aspect of the invention provides a method and an apparatus for encoding erasure code that are capable of storing and recovering data in a safe and efficient manner.

To achieve the objective above, an embodiment of the invention provides a method of encoding erasure code for storing data that includes: (a) generating a first local parity group that is composed of two or more local parity nodes for data nodes; (b) generating at least one global parity node for the data nodes; (c) generating at least one second local parity group that is composed of two or more local parity nodes for the data nodes; and (d) storing the data nodes, the first local parity group, the second local parity groups, and the global parity nodes.

The local parity nodes of the second local parity groups and the local parity nodes of the first local parity group may be generated without overlap.

The same number of data nodes may be used for generating each local parity node.

The number of second local parity groups may be smaller than the number of data nodes used for generating a local parity node of the first local parity group.

Another embodiment of the invention provides a method of encoding erasure code for storing data that includes: (a) generating a first local parity group that is composed of two or more local parity nodes for data nodes; (b) generating a multiple number of global parity nodes for the data nodes; (c) storing the data nodes, the first local parity group, and the global parity nodes; (d) calculating an average erasure probability by monitoring the stored nodes; (e) converting at least one global parity node from among the generated multiple number of global parity nodes into a second local parity group composed of two or more local parity nodes for the data nodes if the average erasure probability exceeds a threshold value; and (f) re-storing the data nodes, the first local parity group, the second local parity group, and global parity nodes unconverted in step (e).

The local parity nodes of the second local parity group and the local parity nodes of the first local parity group may be generated without overlap.

The same number of data nodes may be used for generating each local parity node.

The number of second local parity groups may be smaller than the number of data nodes used for generating a local parity node of the first local parity group.

The average erasure probability may be calculated by the equation below:

$$p_e = \frac{1}{n}\sum_{i=1}^{n} p_i = \frac{1}{n}\sum_{i=1}^{n} \frac{f_i}{N_{m,i}}$$

where $P_e$ is the average erasure probability, n is the number of nodes, $P_i$ is an average erasure probability of each node, $N_{m,i}$ is a number of periodical monitoring of each node, and $f_i$ is the number of node failures of each node occurring during monitoring.

Yet another embodiment of the invention provides an apparatus for encoding erasure code for storing data that includes: a first local parity node generation unit configured to generate a first local parity group that is composed of two or more local parity nodes for data nodes; a global parity node generation unit configured to generate at least one global parity node for the data nodes; a second local parity node generation unit configured to generate a second local parity group that is composed of two or more local parity nodes for data nodes; and a control unit configured to store the data nodes, the first local parity group, the second local parity groups, and the global parity nodes.

The local parity nodes of the second local parity group and the local parity nodes of the first local parity group may be generated without overlap.

The same number of data nodes may be used for generating each local parity node.

The number of second local parity groups may be smaller than the number of data nodes used for generating a local parity node of the first local parity group.

An embodiment of the invention may provide the advantageous effect of allowing safe and efficient storage and recovery.

DETAILED DESCRIPTION OF THE INVENTION

Figure 1:
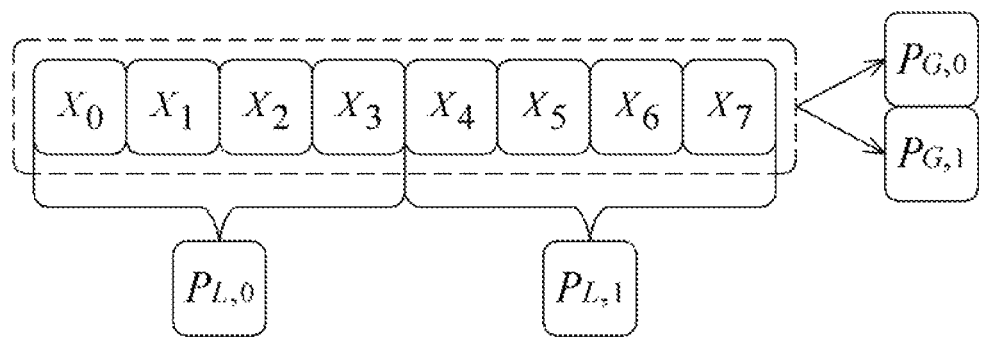
FIG. 1 is a diagram for explaining an LRC.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, similar reference numerals are used for similar elements.

While such terms as "first" and "second," etc., may be used to describe various elements, such elements must not be limited to the above terms. The above terms are used only to distinguish one element from another. For example, a first element may be referred to as a second element without departing from the scope of rights of the present invention, and likewise a second element may be referred to as a first element. Certain embodiments of the present invention are described below in more detail with reference to the accompanying drawings.

In a distributed storage device, information can be lost due to a variety of factors as information stored distributed over multiple nodes is retrieved. An embodiment of the invention presents a method of encoding erasure code for recovering such lost information.

An example of a typically used encoding method for erasure code is the RS (Reed-Solomon) code, which is a type of MDS (maximum distance separable) code. An RS code expressed as (n,k)-RS represents an RS code having a total of n nodes, including a k number of data nodes and an (n−k) number of parity nodes. The RS code, which is an MDS code, can recover an arbitrary (n−k) number of node failures and is characterized in that the average reconstruction cost C is the constant at k. Here, the reconstruction cost refers to the number of other nodes required when recovering a node failure, and the average reconstruction cost refers to the average of reconstruction costs for all cases of arbitrary node failures. Also, the storage overhead S can be expressed as a ratio of the number of data nodes k and the total number of nodes n as s=(n/k).

An embodiment of the invention may basically use an LRC (locally repairable code), which is efficient when recovering a single node failure. That is, when comparing the RS code with the LRC, the LRC may be very efficient when recovering a single node failure rather than recovering multiple node failures. An LRC expressed as (k,l,g)-LRC represents an LRC having a total of (k+l+g) nodes, including a k number of data nodes, an l number of local parity nodes, and a g number of global parity nodes. The number of data nodes used in generating one local parity node may be referred to as locality, where locality L=(k/l).

FIG. 1 shows the structure of an (8,2,2)-LRC. $x_0$, $x_1$, ..., $x_7$ represents the eight data nodes, $P_{L,0}$ and $P_{L,1}$ represent the two local parity nodes, and $P_{G,0}$ and $P_{G,1}$ represent the two global parity nodes. Also, the local parity node $P_{L,0}$ may be generated with $x_0$, $x_1$, $x_2$, and $x_3$, the local parity node $P_{L,1}$ may be generated with $x_4$, $x_5$, $x_6$, and $x_7$, and the global parity nodes $P_{G,0}$, $P_{G,1}$ may each be generated with all data nodes.

Therefore, the procedure for generating the local parity and global parity nodes of a (k,l,g)-LRC can be expressed by the equation below.

$$(x_0, x_1, \ldots, x_{k-1}) \times G = (x_0, x_1, \ldots, x_{k-1}, p_{L,0}, p_{L,1}, \ldots, p_{L,l-1}, p_{G,0}, p_{G,1}, \ldots, p_{G,g-1})$$ [Equation 1]

In Equation 1, $x_0, x_1, \ldots, x_{k-1}$ are the k number of data nodes, $P_{L,0}, P_{L,1}, \ldots, P_{L,l-1}$ are the l number of local parity nodes, $P_{G,0}, P_{G,1}, \ldots, P_{G,g-1}$ are the g number of global parity nodes, and G is a generator matrix of dimension (k×n) having finite field elements.

For instance, the generator matrix G in the (8,2,2)-LRC illustrated in FIG. 1 is as the equation shown below.

$$G = \begin{bmatrix} 1 & 0 & 0 & 0 & 0 & 0 & 0 & 0 & 1 & 0 & \alpha_0 & \alpha_0^2 \\ 0 & 1 & 0 & 0 & 0 & 0 & 0 & 0 & 1 & 0 & \alpha_1 & \alpha_1^2 \\ 0 & 0 & 1 & 0 & 0 & 0 & 0 & 0 & 1 & 0 & \alpha_2 & \alpha_2^2 \\ 0 & 0 & 0 & 1 & 0 & 0 & 0 & 0 & 1 & 0 & \alpha_3 & \alpha_3^2 \\ 0 & 0 & 0 & 0 & 1 & 0 & 0 & 0 & 0 & 1 & \alpha_4 & \alpha_4^2 \\ 0 & 0 & 0 & 0 & 0 & 1 & 0 & 0 & 0 & 1 & \alpha_5 & \alpha_5^2 \\ 0 & 0 & 0 & 0 & 0 & 0 & 1 & 0 & 0 & 1 & \alpha_6 & \alpha_6^2 \\ 0 & 0 & 0 & 0 & 0 & 0 & 0 & 1 & 0 & 1 & \alpha_7 & \alpha_7^2 \end{bmatrix}$$ [Equation 2]

In Equation 2, $\alpha_i$ represents a finite field element.

Figure 2A:
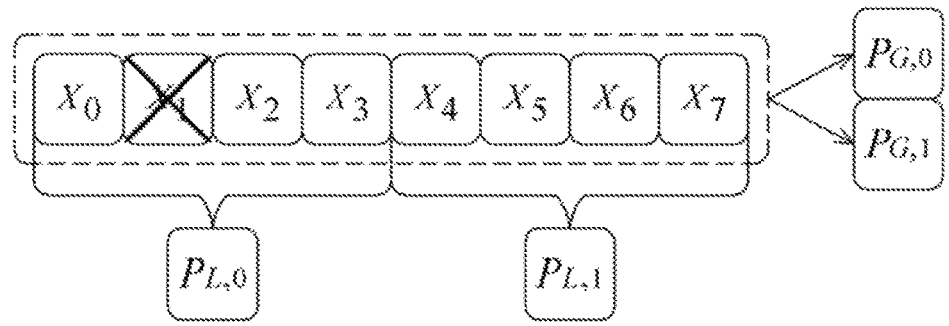
FIG. 2A, FIG. 2B, and FIG. 2C are diagrams for describing cases where node failures occur in the LRC illustrated in FIG. 1.
Figure 2B:
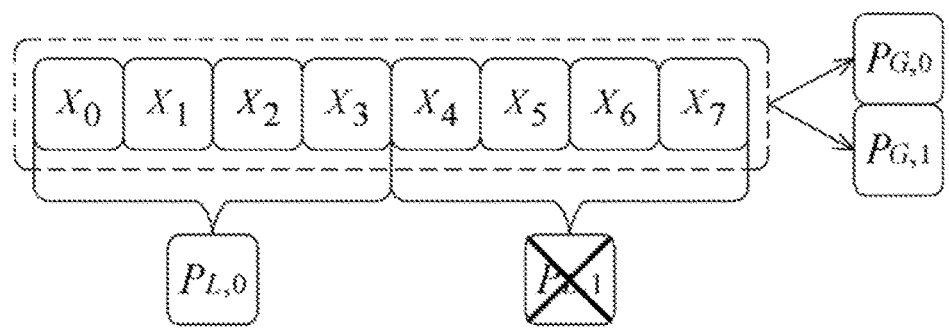
Figure 2C:
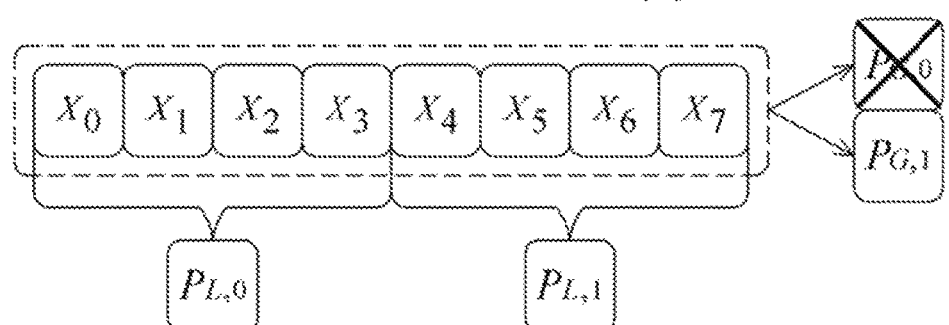

FIG. 2A, FIG. 2B, and FIG. 2C are diagrams for describing cases where node failures occur in the LRC illustrated in FIG. 1.

FIG. 2A shows a case in which a node failure has occurred in a single data node $x_1$. In such a case, $x_1$ can be recovered by using four nodes $x_0$, $x_2$, $x_3$, $P_{L,0}$, and the reconstruction cost is 4.

FIG. 2B shows a case in which a node failure has occurred in a local parity node $P_{L,1}$. In such a case, $P_{L,1}$ can be recovered by using four nodes $x_4$, $x_5$, $x_6$, $x_7$, and the reconstruction cost is 4.

FIG. 2C shows a case in which a node failure has occurred in a global parity node $P_{G,0}$. In such a case, $P_{G,0}$ can be recovered by using eight nodes $x_0, \ldots, x_7$, and the reconstruction cost is 8.

Therefore, the average reconstruction cost for a single node failure of the (8,2,2)-LRC is $$C = \frac{4 \times 10 + 8 \times 2}{12} \simeq 4.67.$$

Also, an LRC allows a 100% recovery for an (n-k-l) number of node failures and allows probabilistic recovery for an (n-k) number of node failures. For instance, with the (8,2,2)-LRC illustrated in FIG. 1, 100% recovery is possible for three or fewer node failures, and 85.86% recovery is possible for four node failures.

With the LRC, whereas cases of two or more recoverable node failures may yield an average reconstruction cost C that is constant at k, cases of a single node failure may yield an average reconstruction cost that is lower than k. Therefore, the LRC may be more efficient than the RS code for recovering a single node failure.

Figure 3:
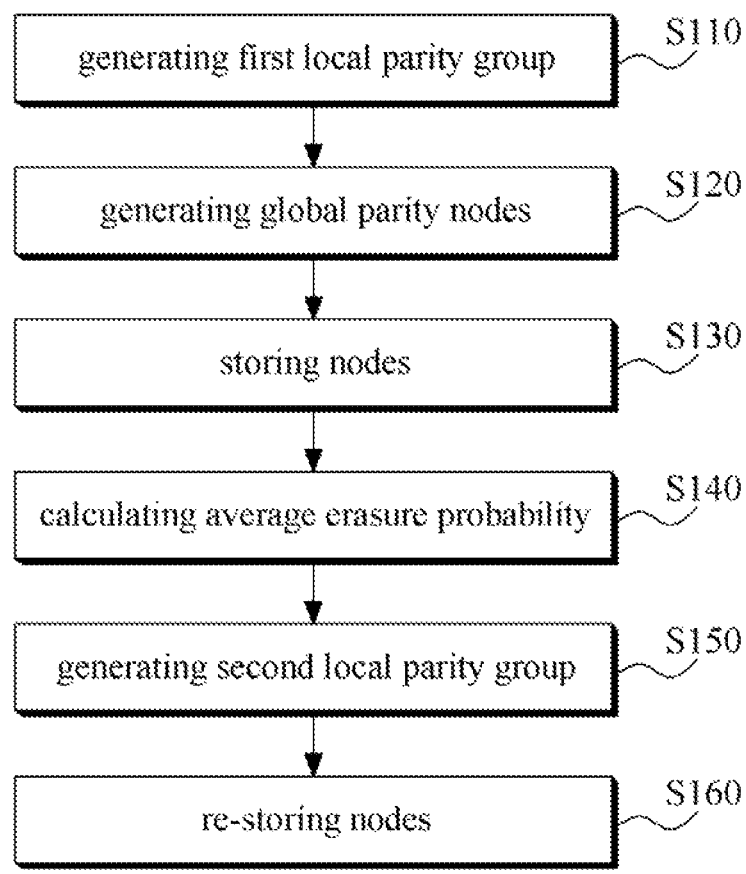
FIG. 3 is a flowchart illustrating a method of encoding erasure code for storing data according to an embodiment of the invention, shown according to time.

FIG. 3 is a flowchart illustrating a method of encoding erasure code for storing data according to an embodiment of the invention, shown according to time.

Referring to FIG. 3, a method of encoding erasure code for storing data according to an embodiment of the invention can include generating a first local parity group (operation S110), generating global parity nodes (operation S120), storing nodes (operation S130), calculating an average erasure probability (operation S140), generating a second local parity group (operation S150), and re-storing nodes (operation S160).

Generating the first local parity group (operation S110) and generating the global parity nodes (operation S120) can be performed in the same manner as for the procedures associated with generating the local parity nodes and global parity nodes of the LRC described above.

The first local parity group may be a group composed of local parity nodes in an LRC. Therefore, the first local parity group and the global parity nodes can be generated by using Equation 1.

Storing the nodes (operation S130) may be an operation of storing data by using the LRC generated in operation S110 and operation S120. The nodes stored by using the LRC may be monitored in operation S140.

Calculating the average erasure probability (operation S140) may be an operation of monitoring the nodes stored in operation S130 and calculating the average erasure probability of the nodes.

The average erasure probability $P_e$ is the average of the erasure probability values $P_i$ of n nodes and can be calculated by the equation below.

$$p_e = \frac{1}{n}\sum_{i=1}^{n} p_i = \frac{1}{n}\sum_{i=1}^{n} \frac{f_i}{N_{m,i}} \quad \text{[Equation 3]}$$

In Equation 3, $N_{m,i}$ is the number of periodical monitoring of each node, and $f_i$ is the number of node failures of each node that occurred during monitoring.

A method of encoding erasure code for storing data according to an embodiment of the invention may use an E-LRC instead of the conventional LRC when the average erasure probability $P_e$, of the nodes exceeds a threshold $P_{e,th}$. Here, the E-LRC is a novel method of encoding erasure code presented by the present invention.

In the E-LRC, a portion of the global parity nodes of the LRC can be generated to be divided into local parities. Although the E-LRC provides a larger storage overhead S compared to the LRC, the reconstruction costs for a single node failure and multiple node failures may be reduced compared to the LRC, and the number of cases of node failures that can be recovered is also higher.

In a conventional (k,l,g)-LRC, if an m number of global parity nodes are each divided into an $l_0, l_1, \ldots, l_{m-1}$ number of local parity nodes, then a (k, l, $l_0$, $l_1$, ..., $l_{m-1}$, g-m)E-LRC can be generated. Here, sets having the l, $l_0$, $l_1, \ldots, l_{m-1}$ local parity nodes may be defined as local parity groups. In particular, in the present invention, the group having an l number of local parity nodes composed of the local parity nodes of the conventional (k,l,g)-LRC may be referred to as the first local parity group, and the groups having the other $l_0, l_1, \ldots, l_{m-1}$ local parity nodes may be referred to as second local parity groups. The parameters of the (k, l, $l_0$, $l_1, \ldots, l_{m-1}$, g-m)E-LRC mean that the number of data nodes is k, the numbers of local parity nodes of the local parity groups are l, $l_0$, $l_1, \ldots, l_{m-1}$, respectively, and the number of global parity nodes is (g-m).

In the (k, l, $l_0$, $l_1, \ldots, l_{m-1}$, g-m)E-LRC, the number of second local parity groups m is smaller than the locality L, which is the number of data nodes used in generating one local parity node. Therefore, the local parity nodes of all local parity groups can be generated without overlap. Also, the number of data nodes used for generating all of the local parity nodes can be the same as L.

That is, the first local parity nodes $P_{L_0,0}, P_{L_1,0}, \ldots, P_{L_{m-1},0}$ of the first local parity group may be generated with an L number of data nodes $x_1, x_{i+1}, \ldots, x_{i+L-1}$, where i=0. Also, the first local parity nodes of each second local parity group may be generated with an L number of data nodes $x_1$, $x_{i+1}, \ldots, x_{i+L-1}$, where i is an element of $\{1, 2, 3, \ldots, L-1\}$ without overlapping.

Figure 4:
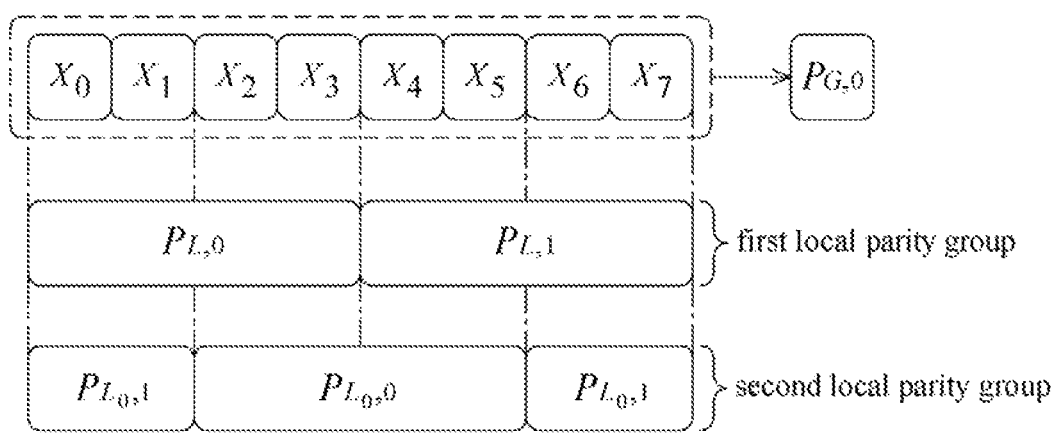
FIG. 4 is a diagram for explaining an E-LRC.

FIG. 4 is a diagram for explaining an E-LRC.

The E-LRC illustrated in FIG. 4 represents an (8,2,2,1) E-LRC generated by dividing a global parity node in the (8,2,1)-LRC illustrated in FIG. 1.

Referring to FIG. 1 and FIG. 4, it can be seen that in the (8,2,2,1)E-LRC, m=1, L=4, k=8, l=2, $l_0$=2, and g=1. That is, it can be seen that the second local parity group of the (8,2,2,1)E-LRC was generated by dividing the global parity node $P_{G,1}$ of the (8,2,1)-LRC.

Therefore, the procedures for generating the first local parity group, global parity nodes, and second local parity group for the (8,2,2,1)E-LRC illustrated in FIG. 4 can be expressed as the equations shown below.

$$p_{L,0} = x_0 + x_1 + x_2 + x_3,$$
$$p_{L,1} = x_4 + x_5 + x_6 + x_7,$$
$$p_{L_0,0} = \alpha_2^2 x_2 + \alpha_3^2 x_3 + \alpha_4^2 x_4 + \alpha_5^2 x_5,$$
$$p_{L_0,1} = \alpha_0^2 x_0 + \alpha_1^2 x_1 + \alpha_6^2 x_6 + \alpha_7^2 x_7,$$
$$p_{G,0} = \alpha_0 x_0 + \alpha_1 x_1 + \ldots + \alpha_7 x_7, \quad \text{[Equation 4]}$$

In Equation 4, $\alpha_i$ represents a finite field element.

Generating a second local parity group (operation S150) may be an operation of generating a second local parity group by using the E-LRC described above.

As described above, the second local parity group can be generated by dividing a global parity node of operation S120. The number of second local parity groups may be smaller than the number of data nodes L used for generating a local parity node, and the number of data nodes used for generating each local parity node may be the same. Also, the local parity nodes of the second local parity group and the local parity nodes of the first local parity group may be generated without overlapping one another.

Re-storing the nodes (operation S160) may be an operation of storing the nodes generated by using the E-LRC.

The global parity nodes that were not used in the generating of second local parity groups in operation S150 from among the global parity nodes generated in operation S120, the data nodes, the local parity nodes of the first local parity group generated in operation S110, and the local parity nodes of the second local parity groups generated in operation S150 can be stored.

Figure 5:
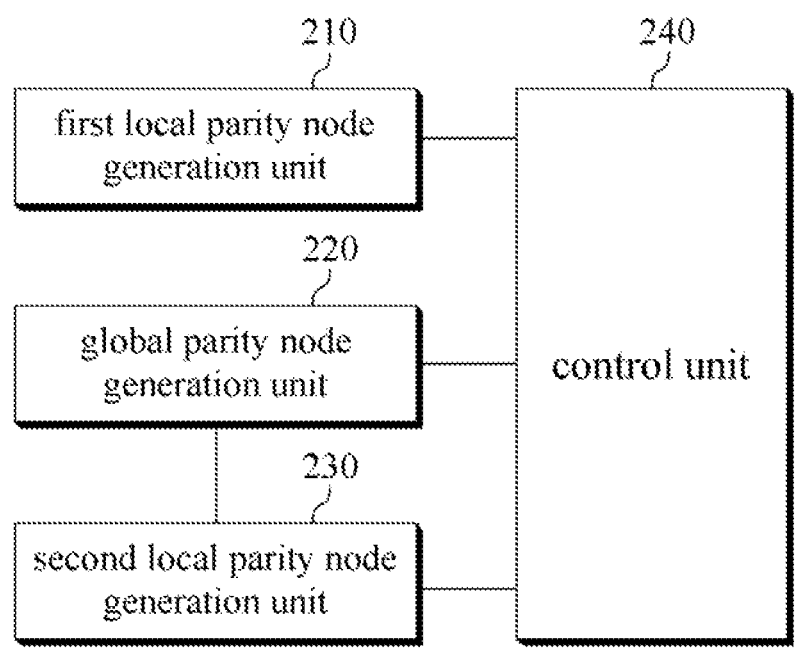
FIG. 5 is a diagram illustrating an apparatus for encoding erasure code for storing data according to an embodiment of the invention.

FIG. 5 is a diagram illustrating an apparatus for encoding erasure code for storing data according to an embodiment of the invention.

Referring to FIG. 5, an apparatus for encoding erasure code for storing data according to an embodiment of the invention can include a first local parity node generation unit 210, a global parity node generation unit 220, a second local parity node generation unit 230, and a control unit 240.

The apparatus for encoding erasure code for storing data according to an embodiment of the invention may store data nodes, local parity nodes, and global parity nodes according to the E-LRC procedures described above.

The first local parity node generation unit 210 can generate a first local parity group in accordance with operation S110.

The global parity node generation unit 220 can generate global parity nodes in accordance with operation S120.

The second local parity node generation unit 230 can generate a second local parity group in accordance with operation S150.

The control unit 240 can store the nodes generated by the first local parity node generation unit 210, global parity node generation unit 220, and second local parity node generation unit 230 in accordance with operation S160.

Figures 6, 7:
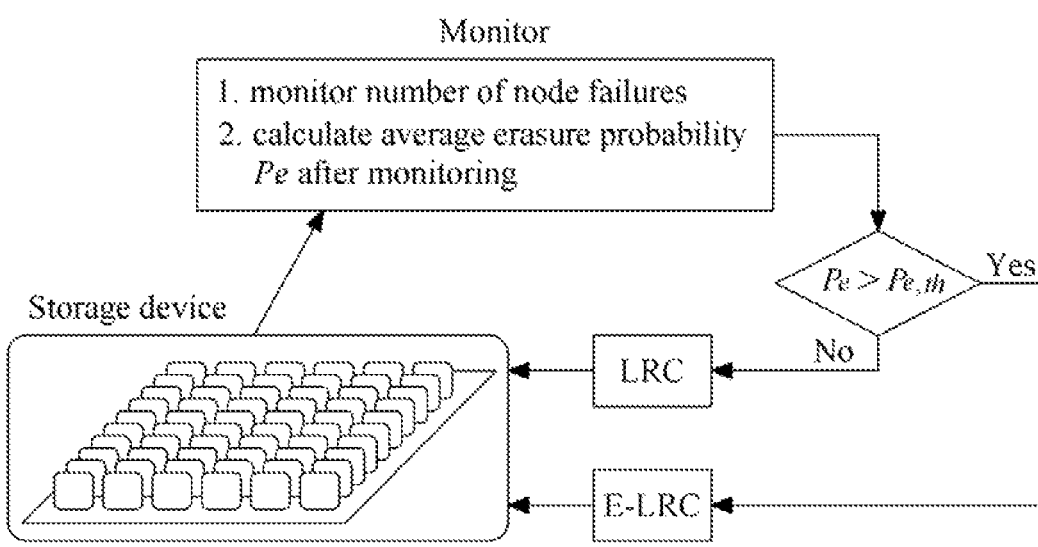
FIG. 6 is a graph illustrating the probability of recovery for various cases of node failures for LRC and E-LRC.
FIG. 7 is a block diagram illustrating an algorithm for a method of encoding erasure code for storing data according to an embodiment of the invention.

FIG. 6 is a graph illustrating the probability of recovery for various cases of node failures for LRC and E-LRC.

Referring to FIG. 6, the LRC and the E-LRC both provide a recovery probability of 100% up to three node failures, but when the number of node failures reaches four, the recovery probability of the LRC is 86%, whereas the recovery probability of the E-LRC is superior at 97%. Also, whereas the LRC is incapable of providing recovery when the number of node failures is five, it can be seen that the E-LRC provides a recovery probability of 80%.

Thus, an embodiment of the invention can calculate the average erasure probability of the nodes to employ the LRC, which entails a smaller overhead, in sections where the number of node failures is three or fewer and employ the E-LRC, which entails a higher recovery probability, in sections where the number of node failures is four or higher, thereby enabling data storage in an efficient and stable manner.

FIG. 7 is a block diagram illustrating an algorithm for a method of encoding erasure code for storing data according to an embodiment of the invention.

Referring to FIG. 7, an embodiment of the invention may first monitor each node by using the LRC, which entails a smaller overhead, and calculate the average erasure probability of the nodes. If node failures occur more frequently so that the average erasure probability exceeds the threshold, an embodiment of the invention may use E-LRC, which entails a higher recovery probability, instead of the LRC. As an embodiment of the invention may thus apply the LRC and the E-LRC adaptively according to circumstances, data can be stored in a stable and efficient manner.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, the spirit of the present invention must not be interpreted as being limited only to the embodiments described above but as encompassing all equivalents and variations of the scope of claims set forth below.

What is claimed is:

1. A method of encoding erasure code for storing data, the method comprising:
   (a) generating a first local parity group composed of two or more local parity nodes for data nodes;
   (b) generating at least one global parity node for the data nodes;
   (c) generating at least one second local parity group composed of two or more local parity nodes for the data nodes; and
   (d) storing the data nodes, the first local parity group, the second local parity group, and the global parity node, wherein the local parity nodes of the second local parity group and the local parity nodes of the first local parity group are generated without overlap.

2. The method of encoding erasure code for storing data according to claim 1, wherein a same number of data nodes is used for generating each local parity node.

3. The method of encoding erasure code for storing data according to claim 1, wherein a number of the second local parity group is smaller than a number of data nodes used for generating a local parity node of the first local parity group.

4. A method of encoding erasure code for storing data, the method comprising:
   (a) generating a first local parity group composed of two or more local parity nodes for data nodes;
   (b) generating a plurality of global parity nodes for the data nodes;
   (c) storing the data nodes, the first local parity group, and the global parity nodes;
   (d) calculating an average erasure probability by monitoring the stored nodes;
   (e) converting at least one global parity node from among the generated plurality of global parity nodes into a second local parity group if the average erasure probability exceeds a threshold value, the second local parity group composed of two or more local parity nodes for the data nodes; and
   (f) re-storing the data nodes, the first local parity group, the second local parity group, and global parity nodes unconverted in said step (e).

5. The method of encoding erasure code for storing data according to claim 4, wherein the local parity nodes of the second local parity group and the local parity nodes of the first local parity group are generated without overlap.

6. The method of encoding erasure code for storing data according to claim 4, wherein a same number of data nodes is used for generating each local parity node.

7. The method of encoding erasure code for storing data according to claim 4, wherein a number of the second local parity group is smaller than a number of data nodes used for generating a local parity node of the first local parity group.

8. The method of encoding erasure code for storing data according to claim 4, wherein the average erasure probability is calculated by an equation shown below:

$$p_e = \frac{1}{n}\sum_{i=1}^{n} p_i = \frac{1}{n}\sum_{i=1}^{n} \frac{f_i}{N_{m,i}}$$

where $P_e$ is the average erasure probability, n is a number of nodes, $P_i$ is an average erasure probability of each node, $N_{m,i}$ is a number of periodical monitoring of each node, and $f_i$ is a number of node failures of each node occurring during monitoring.

9. An apparatus for encoding erasure code for storing data, the apparatus comprising:
   a first local parity node generation unit configured to generate a first local parity group composed of two or more local parity nodes for data nodes;
   a global parity node generation unit configured to generate at least one global parity node for the data nodes;
   a second local parity node generation unit configured to generate at least one second local parity group composed of two or more local parity nodes for data nodes; and a control unit configured to store the data nodes, the first local parity group, the second local parity group, and the global parity nodes, wherein a same number of data nodes is used for generating each local parity node.

10. The apparatus for encoding erasure code for storing data according to claim 9, wherein a number of the second local parity group is smaller than a number of data nodes used for generating a local parity node of the first local parity group.

* * * * *